United States Patent [19]
Axer

[11] Patent Number: 5,285,082
[45] Date of Patent: Feb. 8, 1994

[54] INTEGRATED TEST CIRCUITS HAVING PADS PROVIDED ALONG SCRIBE LINES

[75] Inventor: Klaus Axer, Lubeck, Fed. Rep. of Germany

[73] Assignee: U.S. Philips Corporation, New York, N.Y.

[21] Appl. No.: 8,047

[22] Filed: Jan. 22, 1993

Related U.S. Application Data

[63] Continuation of Ser. No. 610,600, Nov. 8, 1990, abandoned.

[30] Foreign Application Priority Data

Nov. 8, 1989 [DE] Fed. Rep. of Germany ....... 3937187

[51] Int. Cl.$^5$ .................... H01L 21/66; H01L 27/04; G01R 31/26
[52] U.S. Cl. .................... 257/48; 257/620; 257/786
[58] Field of Search ............ 357/40, 45, 41; 324/538; 437/226, 227; 257/48, 620, 786

[56] References Cited

U.S. PATENT DOCUMENTS 5,003,374  3/1991  Vokoun, III ............... 357/52
5,047,711  9/1991  Smith et al. .............. 357/45
5,051,807  9/1991  Morozumi ................. 357/40

FOREIGN PATENT DOCUMENTS 0052860  3/1984  Japan ..................... 357/40
0187354  8/1986  Japan ..................... 357/40
0031148  2/1987  Japan ..................... 357/40
0081724  4/1987  Japan ..................... 357/40
0276735  11/1989 Japan ..................... 357/40
0211648  8/1990  Japan ..................... 357/40
0235356  9/1990  Japan ..................... 357/40

Primary Examiner—Rolf Hille
Assistant Examiner—Peter Toby Brown
Attorney, Agent, or Firm—Steven R. Biren

[57] ABSTRACT

Integrated circuits sometimes include, in addition to the connection surfaces provided for normal operation, additional test pads through which test signals can be put in or read out during testing on the wafer. These connection pads require additional space on the semiconductor slice, so that fewer circuits can be accommodated on a semiconductor slice of a given size. It is proposed to provide the test pads in a row at one or two sides of the circuit and connect them with two adjoining circuits. The cut for separating the chips after manufacture and the test can then take place through these test pads, so that the latter require only little extra space. Advantageously, adjoining circuits will have layouts which are one another's mirrored images.

3 Claims, 1 Drawing Sheet

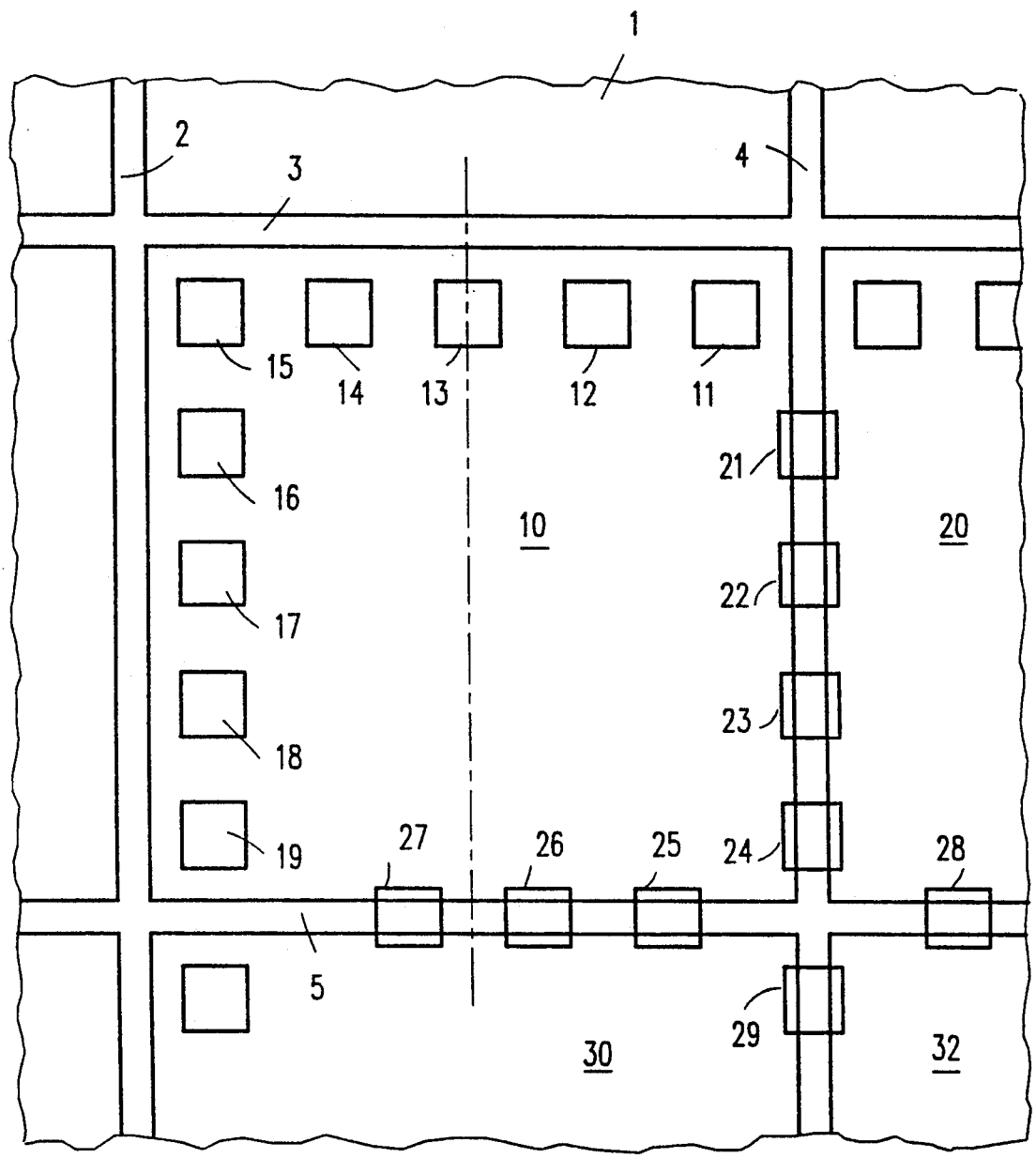
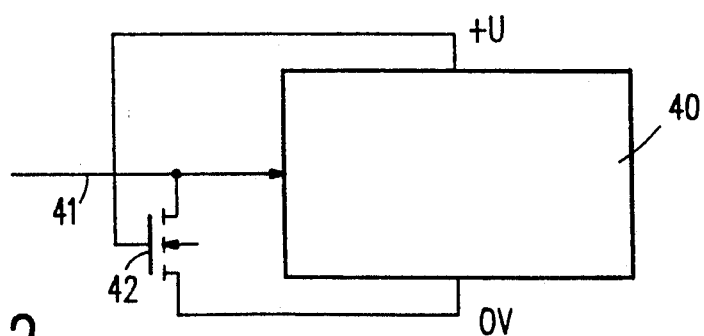
Fig.1
Fig.2

INTEGRATED TEST CIRCUITS HAVING PADS PROVIDED ALONG SCRIBE LINES

This is a continuation of application Ser. No. 07/610,600, filed Nov. 8, 1990 now abandoned.

BACKGROUND OF THE INVENTION

1. Field of the Invention

The invention relates to a method of manufacturing integrated circuits by which a number of similar circuits are manufactured jointly on a semiconductor slice and then separated from one another by cutting, each circuit being provided at the rim with several connection pads, some of which are used exclusively for testing the circuit before it is separated from the adjoining circuits.

The invention also relates to an integrated circuit which is manufactured on a semiconductor slice jointly with a number of similar circuits and then separated from these by cutting, each circuit being provided at the rim with several connection pads, some of which are used exclusively for testing the circuit before it is separated from the adjoining circuits.

2. Description of the Related Art

The manufacture of a large number of integrated circuits together on one semiconductor slice by means of diffusion and etching processes, especially by the use of photolithographic means, is generally known. After these manufacturing steps have all been completed, each single circuit on the semiconductor slice is tested for correct operation in the following way: test probes mounted to a device are put on the connection pads of a circuit each time, and an operating voltage or test signals are supplied and output signals are taken up through these probes. Incorrectly functioning circuits are marked after each test cycle, so that they no longer take part in the subsequent manufacturing steps, especially building-in into a housing and the connection of the connection pads to external connections through wires.

Digital circuits in particular can first be tested only by way of the connections used in normal operation, but such a test is very laborious, for example in the case of highly complex circuits or also circuits with very few external connections, such as, for example, circuits used for contactless chip cards. The test can be substantially simplified when additional connections are applied for testing only, through which the additional test signals are applied to the circuit or output signals are conducted to the exterior, these connections not being used for normal operation. Since the total size of connection pads, however, is relatively great in relation to the elements of the circuit proper, which is also true for the connection pads for testing, a substantial portion of the semiconductor slice is used for such connection pads in this way, so that fewer circuits can be realized on a semiconductor slice of a given size and the manufacturing cost of a single circuit is made higher.

SUMMARY OF THE INVENTION

The invention, therefore, has for its object to provide a method of the kind described above by which the total surface area required for the connection surfaces on the semiconductor slice is kept as small as possible.

According to the invention, this object is achieved in that connection pads used for testing only are provided between at least two adjoining circuits each time at the sides facing one another, which pads are at least partly shared by these circuits and connected to them, and in that the cut for separating the individual circuits is made substantially through these connection pads.

A further object of the invention is to provide an integrated circuit in which the semiconductor surface can be used to the greatest possible extent for the circuit itself and as little as possible of the semiconductor surface area is required for the connection pads.

According to the invention, this object is achieved in that connections used for testing only are arranged at at least one side, are shared with another circuit adjoining this side on the semiconductor slice during manufacture and are also connected to this side, and in that the cut for separating the circuit from the other circuits runs substantially through these connection pads.

The invention advantageously utilizes the fact that connections of a circuit which does not receive its operating voltage are substantially not influenced by this circuit. As a result, these connections can be doubly used, i.e. for two circuits of which one is supplied with an operating voltage each time. Thus these circuits can be supplied with test signals through the same connection pads successively, and signals generated in the circuit can be derived from them. After testing of the circuits, these connections are no longer required and can therefore be destroyed, which takes place through the cut for separating the circuits from one another. In this way the space for a row of connection pads as well as for the distance from the connection pads to the rim or scribing lane is saved for each row of such connection pads doubly used for testing, so that the total semiconductor slice can be more efficiently utilized and more circuits of a given size can be accommodated on a semiconductor slice of a given size.

Since similar or identical circuits are always manufactured on a semiconductor slice, an asymmetrical arrangement will arise in the case of, for example, circuits provided two-by-two with joint test connection pads, since these test connection pads are positioned, for example, on the right-hand side in the one circuit and on the left-hand side in the other circuit. Preferably, if the same planar arrangement is to be used for all circuits, these circuits can be arranged two-by-two on the semiconductor slice rotated through 180° relative to one another, the test connection hence being differently assigned to the two circuits. This does not always result in the most favorable space utilization, however, especially if the connections used for normal operation of the circuit can only be applied to a single further side. According to an embodiment of the invention, therefore, it is advantageous that adjoining circuits have arrangements which are one another's mirror images at the side at which the shared connection pads are arranged. This requires hardly any additional effort in the design of the circuit layout and in the manufacture of the required masks.

If in this case the connection pads are provided at a side of the circuit which is perpendicular to the side having the shared test connection pads, the arrangement of these connection pads for normal operation is also mirror-imaged, whereas the housings into which the circuits are built in should always have the same connection configuration on the outside. Furthermore, the manufacture of the wire connections between the connection pads and the external connections of the housing generally takes place by means of programmed automatic units. If a uniform connection configuration of the connection pads, seen from the outside, is to be achieved in spite of the mirror-imaged arrangement, it is favorable according to a further embodiment of the invention that the connection pads provided for the normal operation of the circuit are provided in twofold in a mirror-imaged sequence with respect to the centerline parallel to the side having the shared connection pads. It is true that in this way more connection pads are required, but these double connection pads do not require any additional surface area on the semiconductor slice in the case of circuits having only few connections for normal operation, such as, for example, for contactless chip cards or other applications, in which the circuit is in connection with the surroundings exclusively via one or two coils or capacitor surfaces, as long as these connection pads can furthermore be provided at one side of the circuit, since the cuts for separating the individual circuits can in all cases only be straight ones.

If the cut runs through the connection pads, it is possible that material of these connection pads is smudged out, so that adjoining connection pads are connected with one another. To take this into account, it is favorable according to another embodiment of the invention that at least those connection pads which are common to two adjoining circuits before separation of the circuits and which represent inputs, are each connected to a given potential, particularly a pole of the operating voltage, each via a conducting element within the circuit while the operating voltage is applied. The circuit is then advantageously so designed that this common potential at the test connection pads does not influence the function of the circuit during normal operation. The conducting element may be constituted by, for example, a transistor which connects the relevant connection to the given potential via a comparatively low-ohmic resistance. If no switch-over between test operation and normal operation is incorporated in the circuits, these transistors are also conducting during testing of the circuits on the semiconductor slice, but the test signals can then be put in at an even lower ohmic resistance, so that the connection to the given potential has no more disturbing effect during testing.

BRIEF DESCRIPTION OF THE DRAWINGS

Embodiments of the invention are explained in more detail below with reference to the drawing. In the drawing:

FIG. 1 shows a portion of a semiconductor slice with several integrated circuits thereon; and FIG. 2 shows an example of a circuit arrangement of a test input.

DESCRIPTION OF THE PREFERRED EMBODIMENTS

On the portion 1 of a semiconductor slice in FIG. 1, there is an integrated circuit 10 together with portions of adjoining circuits 20, 30 and 32, which have shared connection pads. The parts of the other circuits have no connection with these integrated circuits 10, 20, 30 and 32, so they are not represented. Between the individual circuits are shown stripes 2, 3, 4 and 5, which represent the lanes along which the cuts to separate the circuits are made after manufacture and testing of the circuits.

The circuit 10 comprises a number of connection pads 11 to 19, through which signals are supplied or received and, as applicable, supply voltages are fed during normal operation. Furthermore, a number of connection pads 21 to 24 for testing purposes are present, which pads are shared by the two circuits 10 and 20, as well as 25 to 27, which are shared by the two circuits 10 and 30. In addition, a connection pad 28, shared by the two circuits 20 and 32, and a connection pad 29, shared by the two circuits 30 and 32, are represented. Connection pads for normal operation are shown in the circuits 20 and 30, corresponding to the connection pads 11 to 19. The remaining connection pads lie outside the portion 1. The actual integrated circuits connected to the connection pads are not shown in any more detail here for clarity's sake. The integrated circuits 10, 20, 30 and 32 form a cohering quartet on the ground of the shared connection pads. The arrangement of this quartet shown in portion 1 is repeated on the entire semiconductor slice in all directions.

It should be noted that the connections for certain circuits which require only few external connections may be arranged at one side only, i.e. only the connection pads 11 to 15 of FIG. 1 are then present. Similarly, if only few test connection pads are required, these may also be arranged at one side only, i.e. only the connection pads 21 to 24 may be present in the example shown in FIG. 1. In that case the circuits 10 and 20 only would have shared connection pads 21 to 24 and would thus form a couple, while the circuits 30 and 32 would be independent of that couple and would together form another couple.

In the design of an integrated circuit, after the electrical circuit has been laid down, the distribution of the individual elements of the circuit and the connections on the semiconductor slice, i.e. the layout, is often very intricate. It is immediately recognizable, however, in the arrangement shown in FIG. 1 of the circuits on the semiconductor slice that these circuits cannot have exactly the same arrangement since, for example, the test connection pad 21 lies on the right relative to the connection pads 11 to 15 on the circuit 10 and on the left on the circuit 20. To avoid having to design separate layouts for these two circuits, it is possible to arrange these two circuits 10 and 20 as one another's mirror images with the axis of symmetry on the stripe 4. Similarly, the two circuits 10 and 30 may have mirror-imaged layouts with the axis of symmetry in the stripe 5, i.e. the circuit 30 has the same layout as the circuit 20.

In this case the arrangement of the connection pads 11 to 19 relative to their functions or the functions of the signals conducted through them is also mirror-imaged. The connection of the connection pads to the exterior, such as, for example, housing connections, should therefore be made differently in adjoining circuits, i.e. in each circuit it should be ascertained after the separation to which of the two categories it belongs. If only the connection pads 11 to 15 are present in the example shown in FIG. 1, as explained above, the connection pads for at least some of the signals are supplied in twofold in that the arrangement of the connection pads relative to the signals is mirrored about the vertical axis through the center of the circuits and here also through the center of the connection pad 13 as shown by the vertical dashed line in FIG. 1. Thus, the connection pad 11 is interconnected with the connection pad 15, for example also via the integrated circuit itself, and similarly the connection pad 12 is interconnected with the connection pad 14. If only the central connection pad 13 and the connection pads lying on the right of it, i.e. the connection pads 12 and 11 in the present circuit, are connected in each of the circuits separated from one another, each circuit always receives and/or supplies the correct signals in spite of the mirrored arrangement.

If all connection pads 11 to 19 are present as shown in FIG. 1, their arrangement relative to the signals may be mirrored about a diagonal which runs through the connection pad 15, i.e. the connection pad 11 is connected to the connection pad 19, 12 to 18, etc.

The connection pads of an integrated circuit usually consist of an aluminum layer. If cuts by, for example, a diamond saw are made along the lanes 4 or 5, parts of the connection pads 21 to 27 may become smudged out, i.e. form conducting bridges between adjoining connection pads, since the aluminum layer is relatively soft. This would mean that these bridges are present between the test connection pads in the relevant integrated circuit during normal operation, which pads remain after all connected to the relevant integrated circuit afterwards. To eliminate malfunctioning during normal operation owing to these bridges, the electric circuit is so designed that all test inputs do not influence the functioning of the circuit at a certain potential, for example at zero potential, and each test input is connected to ground via a conducting element, for example a resistor or alternatively a transistor, of a relatively low-ohmic resistance.

This is shown in FIG. 2. The electric circuit shown here in a simplified way as block 40 receives a test signal through a line 41 via a test connection pad. This line 41 is connected to 0 V via an enhancement-type field effect transistor 42 when the operating voltage +U is present. A signal supplied by a testing device should therefore be generated and/or supplied with such a low-ohmic resistance that it exceeds the current flowing through the transistor 42. This holds for each further test input (not shown). When no test signal is supplied through the input 41 during normal operation, this input is therefore at 0 V. Test signals derived from the circuit 40 are supplied through a high-ohmic buffer circuit so that, if there should be a bridge between a test output and a test input, the transistor 42 can always bring this test input to 0 V. In this way it is made impossible during normal operation for interconnected test pads to influence one another.

I claim:

1. An integrated circuit which is manufactured on a semiconductor slice jointly with a number of similar adjoining circuits and then separated from these by cutting, each circuit being provided at its rim with a plurality of connection pads, a selected number of which are used exclusively for testing at least the first-mentioned circuit before it is separated from the adjoining circuits, wherein all connection pads used only for testing are arranged at and in physical contact with at least one side of said first-mentioned circuit, are shared with and in physical contact with another circuit adjoining said at least one side on the semiconductor slice during manufacture and are connected to both circuits adjoining said at least one side, said first-mentioned circuit and said another circuit have arrangements which are the mirror images of each other about an axis extending along the side at which the connection pads which are shared are arranged, and the cut for separating the first-mentioned circuit from the adjoining circuits runs through said connection pads used only for testing.

2. An integrated circuit as claimed in claim 1, wherein a plurality of connection pads provided for the operation of the first-mentioned circuit are provided in two-fold in a mirror-imaged sequence with respect to the centerline of the first-mentioned circuit parallel to the side having the shared connection pads.

3. An integrated circuit as claimed in claim 1, wherein at least those of said connection pads which are common to said first-mentioned circuit and said another circuit before separation of the circuits and which represent inputs, are each connected to a pole of the operating voltage by a conducting element while the operating voltage is applied.

* * * * *